(12) United States Patent
Cooke

(10) Patent No.: US 10,989,979 B2
(45) Date of Patent: *Apr. 27, 2021

(54) LOW POWER SEMI-REFLECTIVE DISPLAY

(71) Applicant: NovaSolix, Inc., Newark, CA (US)

(72) Inventor: Laurence H. Cooke, Los Gatos, CA (US)

(73) Assignee: NOVASOLIX, INC., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/545,551

(22) Filed: Aug. 20, 2019

(65) Prior Publication Data

US 2019/0369791 A1 Dec. 5, 2019

Related U.S. Application Data

(60) Division of application No. 16/014,768, filed on Jun. 21, 2018, now Pat. No. 10,437,371, which is a
(Continued)

(51) Int. Cl.
*G06F 3/041* (2006.01)
*G06F 1/26* (2006.01)
(Continued)

(52) U.S. Cl.
CPC .............. *G02F 1/17* (2013.01); *G02B 26/02* (2013.01); *G02F 1/19* (2013.01); *G06F 1/1613* (2013.01); *G06F 1/26* (2013.01); *G06F 1/32* (2013.01); *G06F 3/0412* (2013.01); *G09G 3/2003* (2013.01); *G09G 3/36* (2013.01); *H01L 27/142* (2013.01); *H01L 27/156* (2013.01); *H01L 31/1085* (2013.01); *H02J 7/00* (2013.01); *G09G 3/3433* (2013.01); *G09G 2300/08* (2013.01);
(Continued)

(58) Field of Classification Search
CPC ...... G09G 3/3433; G09G 3/2003; G09G 3/36; G09G 2330/02; G09G 2360/08; G09G 2360/144; G09G 2320/0626; G09G 2300/08; G06F 1/26; G06F 1/1613; G06F 1/32; G06F 3/0412; G02F 1/17; G02F 1/19; G02B 26/02; H01L 27/142; H01L 27/156; H01L 31/1085; H02J 7/00
USPC .......................................................... 345/55
See application file for complete search history.

(56) References Cited

U.S. PATENT DOCUMENTS 4,445,050 A 4/1984 Marks
5,267,193 A 11/1993 Lin
(Continued)

OTHER PUBLICATIONS

Office Action dated Apr. 3, 2015 in U.S. Appl. No. 14/080,280 by Cooke.
(Continued)

*Primary Examiner* — Stephen G Sherman
(74) *Attorney, Agent, or Firm* — Panitch Schwarze Belisario & Nadel LLP

(57) ABSTRACT

A semi-reflective display and a method for fabricating and assembling a semi-reflective display are presented, where the display may be comprised of visible light rectifying antenna arrays tuned to four different colors, which when forward biased may use electric power to amplify reflected colored light, and when reversed biased may generate electric power by absorbing light. TFT-tunnel diode logic may be used to control each sub-pixel.

7 Claims, 20 Drawing Sheets

Related U.S. Application Data continuation of application No. 15/357,576, filed on Nov. 21, 2016, now Pat. No. 10,042,453, which is a continuation of application No. 14/840,128, filed on Aug. 31, 2015, now Pat. No. 9,502,449, which is a continuation of application No. 14/080,280, filed on Nov. 14, 2013, now Pat. No. 9,164,559.

(51) Int. Cl.

| | | |
|---|---|---|
| *H01L 27/142* | (2014.01) | |
| *G02F 1/19* | (2019.01) | |
| *G02F 1/17* | (2019.01) | |
| *G09G 3/36* | (2006.01) | |
| *G09G 3/20* | (2006.01) | |
| *G02B 26/02* | (2006.01) | |
| *H01L 31/108* | (2006.01) | |
| *H02J 7/00* | (2006.01) | |
| *G06F 1/32* | (2019.01) | |
| *H01L 27/15* | (2006.01) | |
| *G06F 1/16* | (2006.01) | |
| *G09G 3/34* | (2006.01) | |

(52) U.S. Cl.
CPC . *G09G 2320/0626* (2013.01); *G09G 2330/02* (2013.01); *G09G 2360/08* (2013.01); *G09G 2360/144* (2013.01)

(56) References Cited

U.S. PATENT DOCUMENTS

| | | | |
|---|---|---|---|
| 5,419,626 A * | 5/1995 | Crockett | G02F 1/133308 |
| | | | 312/223.2 |
| 5,955,981 A | 9/1999 | Rangan | |
| 6,084,579 A | 7/2000 | Hirano | |
| 8,384,690 B2 | 2/2013 | Anderson et al. | |
| 9,164,559 B2 | 10/2015 | Cooke | |
| 9,502,449 B2 | 11/2016 | Cooke | |
| 9,960,480 B2 | 5/2018 | Cooke | |
| 2001/0043513 A1 | 11/2001 | Grupp | |
| 2004/0201526 A1 | 10/2004 | Knowles et al. | |
| 2005/0122294 A1 | 6/2005 | Ben-David et al. | |
| 2007/0018919 A1 | 1/2007 | Zavracky et al. | |
| 2008/0088904 A1 | 4/2008 | Miles | |
| 2008/0264956 A1 * | 10/2008 | Estlander | H05K 5/0208 |
| | | | 220/662 |
| 2009/0149156 A1 | 6/2009 | Yeo | |
| 2009/0280861 A1 | 11/2009 | Khan | |
| 2010/0061703 A1 | 3/2010 | Pham et al. | |
| 2010/0328223 A1 * | 12/2010 | Mockarram-Dorri | |
| | | | G06F 3/041 |
| | | | 345/173 |
| 2011/0031289 A1 * | 2/2011 | Haskell | A45F 5/00 |
| | | | 224/219 |
| 2011/0117974 A1 | 5/2011 | Spitalnik et al. | |
| 2011/0285660 A1 * | 11/2011 | Prabhu | G06F 1/1643 |
| | | | 345/174 |
| 2011/0285942 A1 | 11/2011 | Guo et al. | |
| 2012/0012159 A1 | 1/2012 | Ryu et al. | |
| 2012/0270600 A1 | 10/2012 | Zelson | |
| 2013/0276861 A1 | 10/2013 | Cooke | |
| 2015/0002449 A1 | 1/2015 | Lewis et al. | |

OTHER PUBLICATIONS

Office Action dated Jun. 8, 2015 in U.S. Appl. No. 14/080,280 by Cooke.

Siciliano et al., "Nano-Rectenna for High Efficiency Direct Conversion of Sunlight to Electricity," presented at 17th World Micromachine Summit, Apr. 26-29, 2011.

Office Action dated Apr. 14, 2016 in U.S. Appl. No. 14/840,128, by Cooke.

Office Action dated May 24, 2016 in U.S. Appl. No. 14/840,128, by Cooke.

Office Action dated Jan. 9, 2018 in U.S. Appl. No. 15/357,576, by Cooke.

Office Action dated Mar. 7, 2017 in U.S. Appl. No. 15/357,576, by Cooke.

Office Action dated Jul. 20, 2017 in U.S. Appl. No. 15/357,576, by Cooke.

Office Action dated Nov. 2, 2018 in U.S. Appl. No. 16/014,768 by Cooke.

Office Action dated Mar. 22, 2019 in U.S. Appl. No. 16/014,768 by Cooke.

* cited by examiner

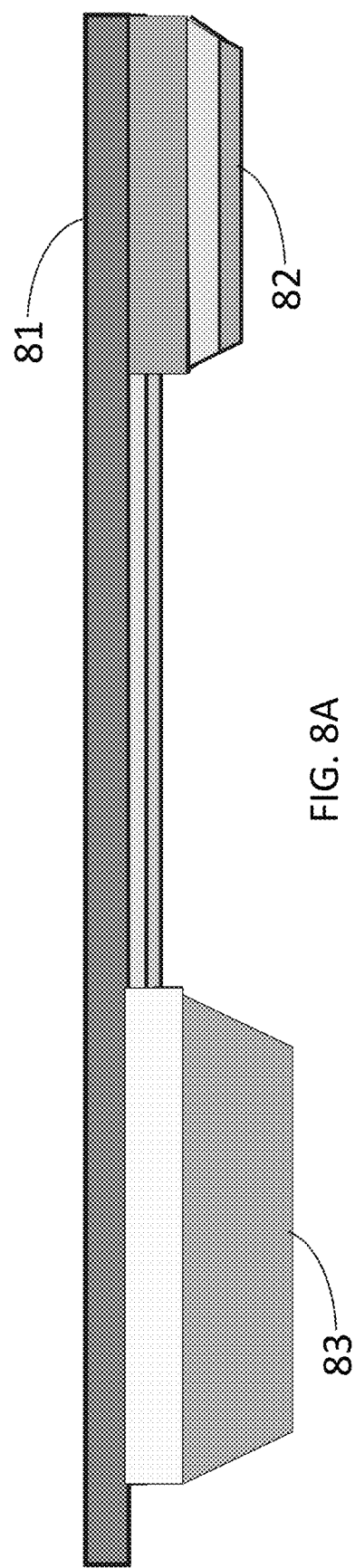
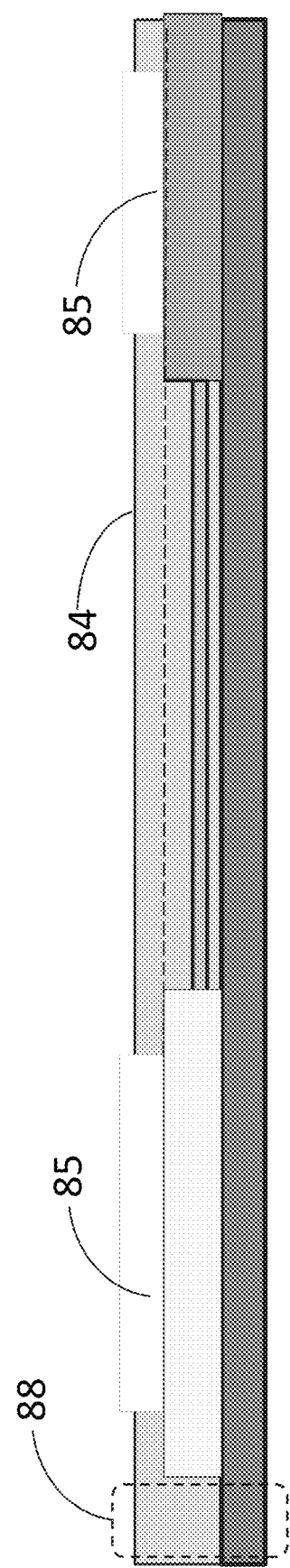
FIG. 8A
FIG. 8B

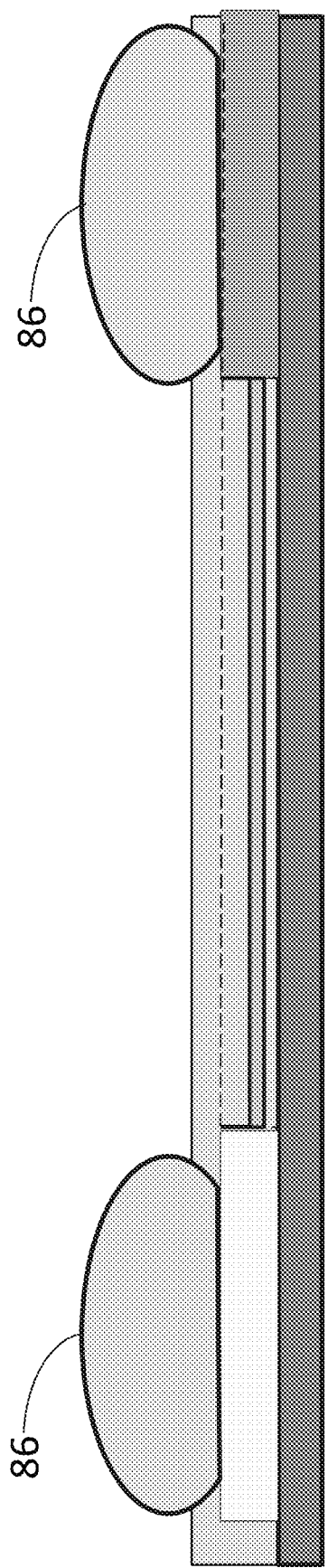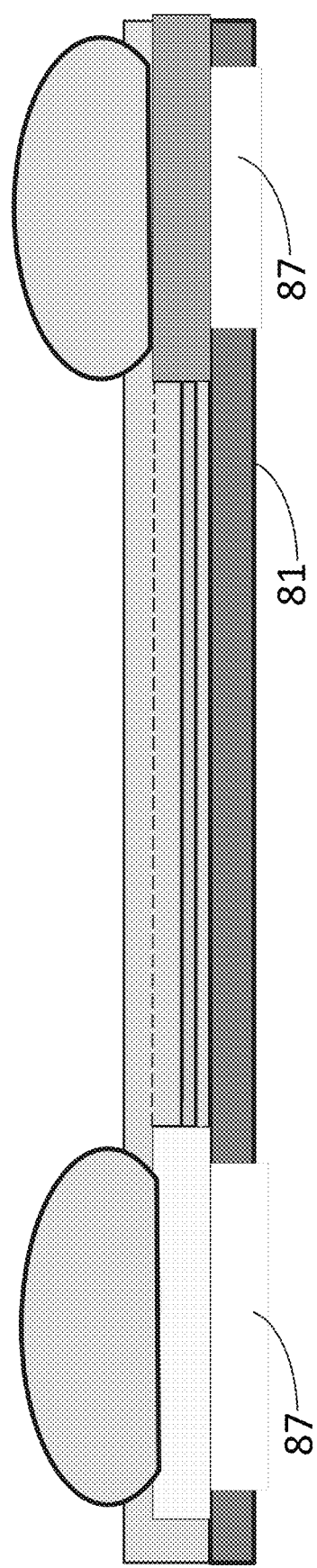

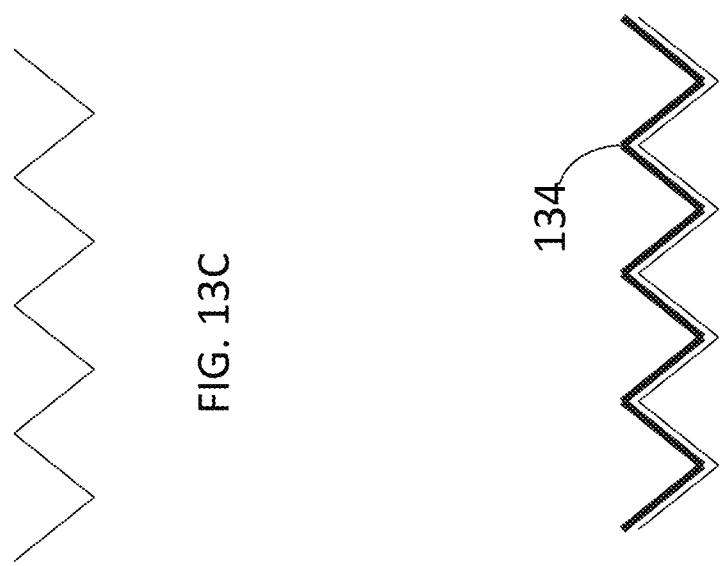
FIG. 13C
FIG. 13D
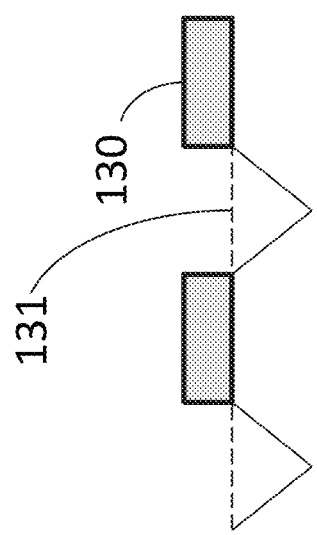
FIG. 13A
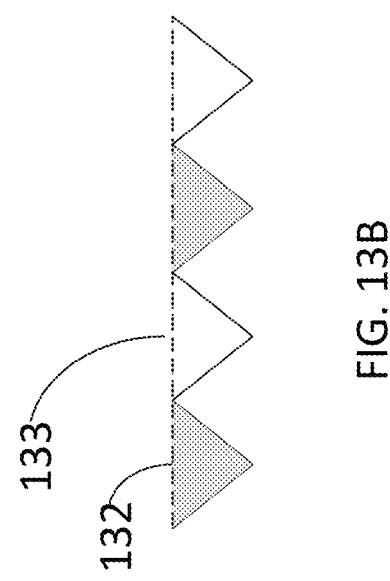
FIG. 13B

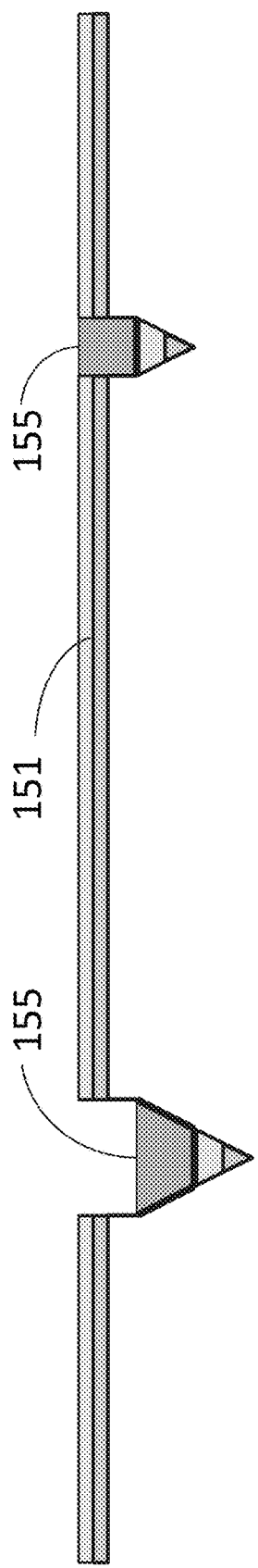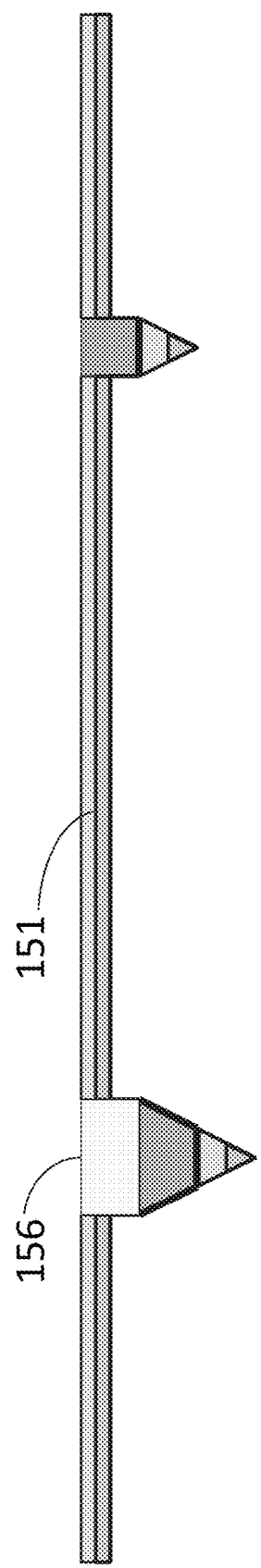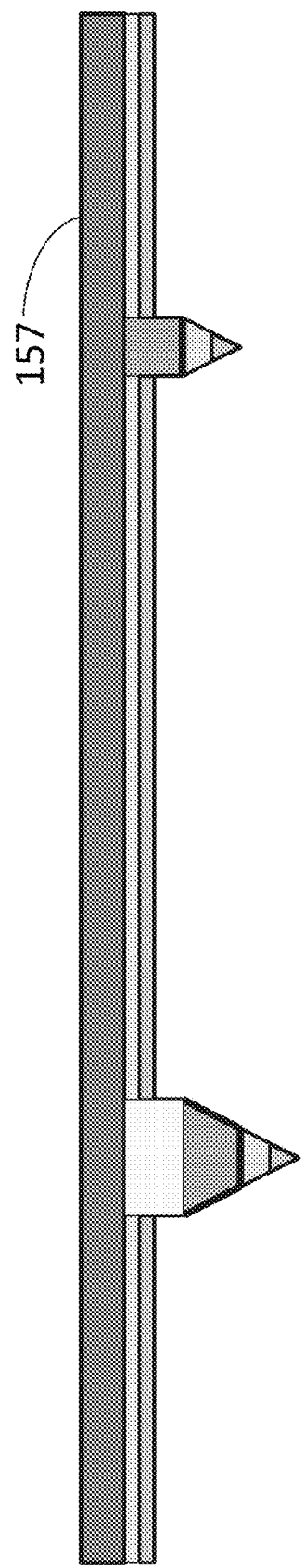

LOW POWER SEMI-REFLECTIVE DISPLAY

CROSS-REFERENCE TO RELATED APPLICATIONS

This application is a divisional of U.S. patent application Ser. No. 16/014,768, filed on Jun. 21, 2018, which is a continuation of U.S. patent application Ser. No. 15/357,576, filed on Nov. 21, 2016, which is a continuation of U.S. patent application Ser. No. 14/840,128, filed on Aug. 31, 2015, which is a continuation of U.S. patent application Ser. No. 14/080,280 filed on Nov. 14, 2013, the contents of which are incorporated by reference herein in their entirety.

FIELD OF THE INVENTION

Various embodiments of the present invention may pertain to the design and/or manufacture of a low-power semi-reflective display comprised of pixel sized visible light rectifying antenna arrays.

BACKGROUND OF THE INVENTION

Battery life has become a major issue in portable electronic equipment. One of the highest uses of power in such devices may be the displays. Alternative technologies such as e-ink have been developed, but they have neither the performance nor color display precision on the current LCD displays. Most of the power used in LCD displays may occur from their back lights, and yet 97% of the generated light may be absorbed by the films and filters in the display itself. Only 3% of the light actually propagates out of the display as the image seen by the viewer. It would be desirable to have a fast switching reflective display. The inventor, in U.S. patent application Ser. 13/454,155 filed Apr. 24, 2012, describes a solar array comprised of an array of visible light antennas coupled to ultra-high-speed rectifying tunnel diodes. Such an array may be a light absorbing solar array, when biased to generate electricity, and light amplifying, when biased to use electricity.

SUMMARY OF EMBODIMENTS OF THE INVENTION

Therefore, various embodiments of the invention may relate to the manufacture and design of a low-power semi-reflective display, which may be comprised of an array of pixels, where each pixel may be further comprised of four sub-pixel sized visible light rectifying antenna arrays, each of which may be individually controlled via TFT-tunnel diode logic, comprising at least one latch, to either absorb light producing electric power or consuming electric power to amplify one of four different colors of light.

In other embodiments of the present invention, a display may be comprised of an array of sub-pixels, where each sub-pixel may be further comprised of at least two layers of arrays of collinear light frequency antenna, where the light frequency antenna in the first of the at least two layers of sub-pixels may be perpendicular to the light frequency antenna in the second of the at least two layers of sub-pixels. Furthermore, solder bumps may perform the electric coupling between the at least two sub-pixel layers and the glass substrate.

BRIEF DESCRIPTION OF THE DRAWINGS

Various embodiments of the invention will now be described in connection with the attached drawings, in which:

FIGS. 8A through 8D depict a process of creating solder bumps for each rectifying antenna array layer, according to an embodiment of the invention;

FIGS. 13A, 13B, 13C and 13D are cross-sections of an example of a stencil in the X-direction during its fabrication;

FIGS. 15A through 15F are cross-sections of an example of an antenna array during fabrication on a stencil;

DETAILED DESCRIPTION OF VARIOUS EMBODIMENTS

Examples of embodiments of the present invention will now be described with reference to FIGS. 1-20, it being appreciated that the figures may illustrate the subject matter of various embodiments and may not be to scale or to measure.

Figure 1:
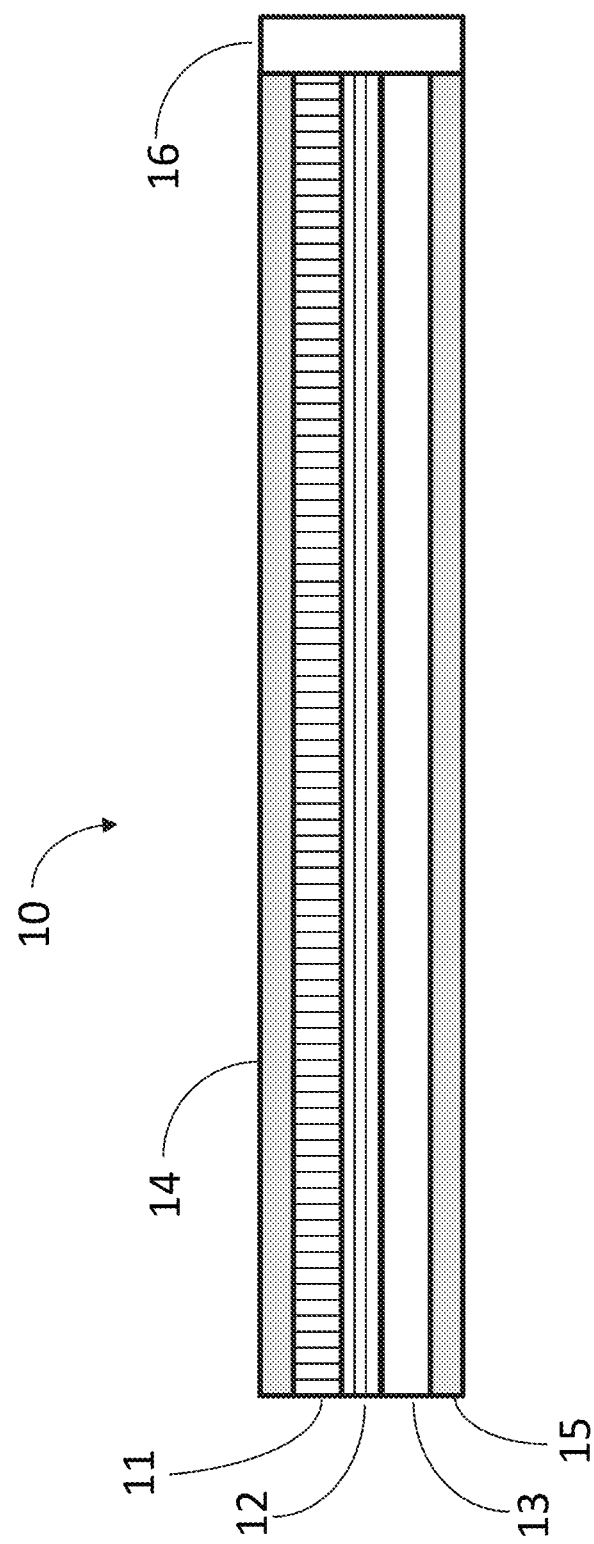
FIG. 1 is a cross section of the reflective display according to an embodiment of the invention.

In one embodiment of the present invention, two polarizing reflective layers may be sandwiched together with a thin film transistor (TFT) glass substrate. Reference is now made to FIG. 1, a cross section of an example of a display

10 that may have a cover glass layer 14, a first layer comprised of sub-pixel sized rectifying antenna arrays 11, a second layer also comprised of sub-pixel rectifying antenna arrays 12 that may be perpendicular to the first layer, a TFT and wiring layer on a clear visible light transmitting glass substrate 13, a light absorbing back cover 15, and other electronics 16, which may include a battery, power supply, and/or pixel clock-driver electronics.

Figure 11:
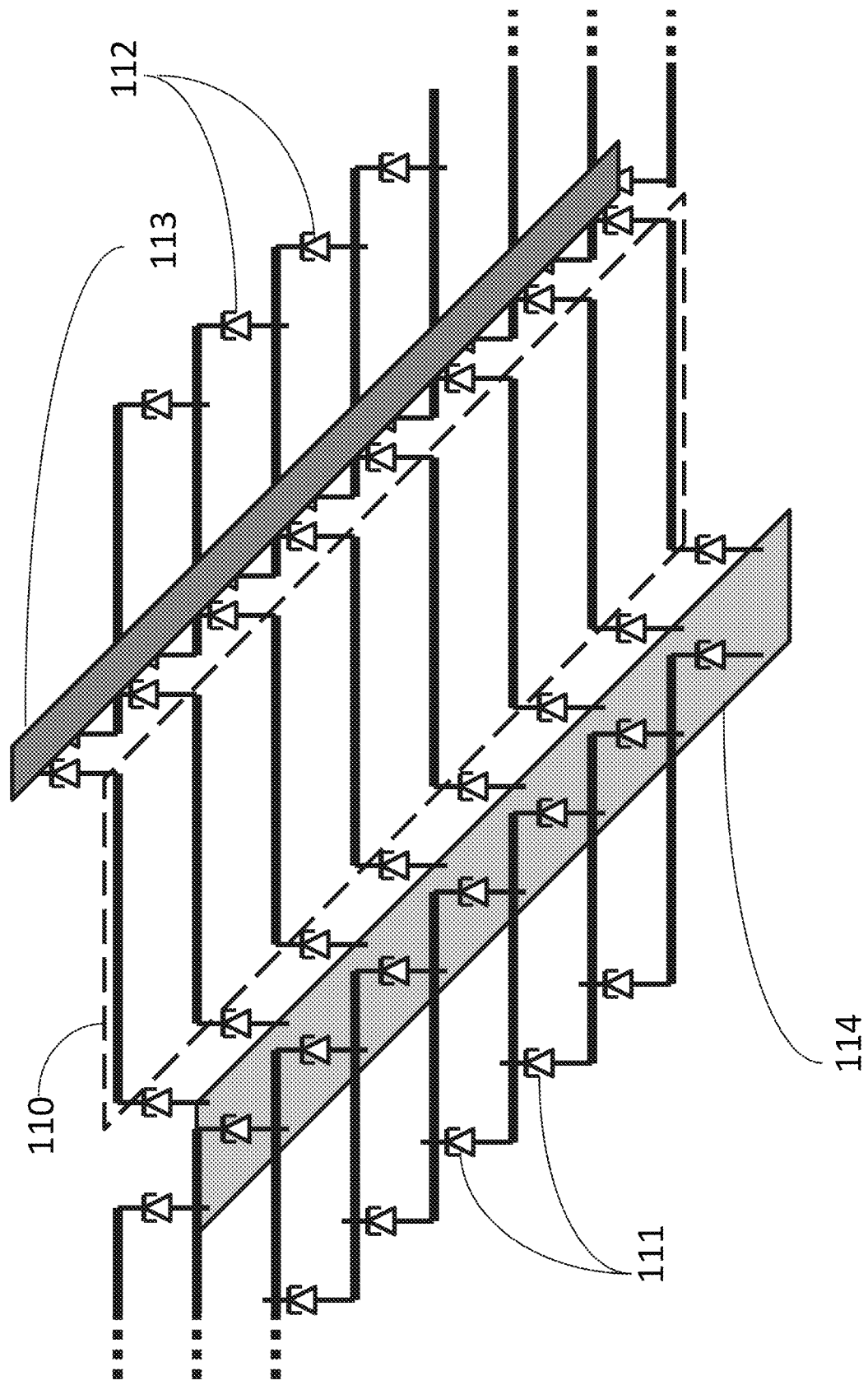
FIG. 11 is a logical diagram of an example of an antenna array, according to an embodiment of the invention.

A logical diagram of an example embodiment of a rectifying antenna array is shown in FIG. 11. The core of an antenna array may have rows of antennas 110, separated by power lines 113 and ground lines 114. The power and ground lines may be respectively coupled to the antennas by rectifying metal-oxide-metal tunnel diodes 111 and 112. If the antennas are excited by visible light, current may flow from the ground line to the power line, which may thus produce rectified electrical energy. For antennas to efficiently receive visible light, it may be advantageous for them to be either ¼ or ½ of the wavelength of the light being captured, which may depend on whether or not the antenna is coupled to an existing ground plane. In order to produce such small structures, without expensive masking operations, one may create a stencil with which to manufacture the antennas.

Most of the antenna array may be constructed on the stencil, such that polishing, applying a protective layer, and applying solder bumps to the sub-pixel antenna array pads may then be performed after removing it from the stencil.

Figure 12A:
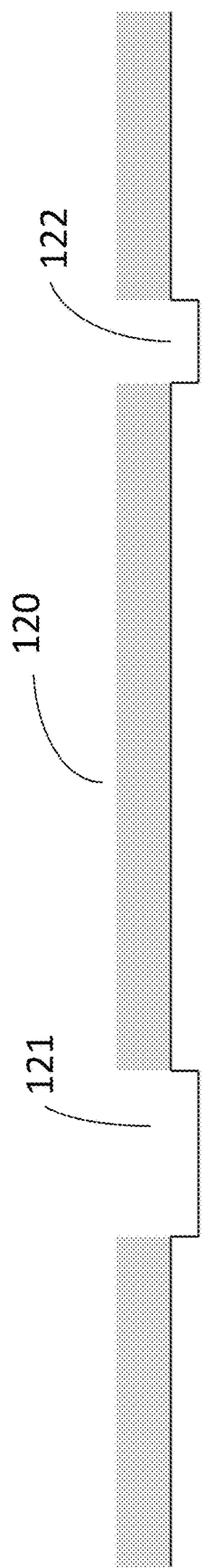
FIGS. 12A, 12B, and 12C are cross-sections of an example of a stencil in the Y-direction during its fabrication.
Figure 12B:
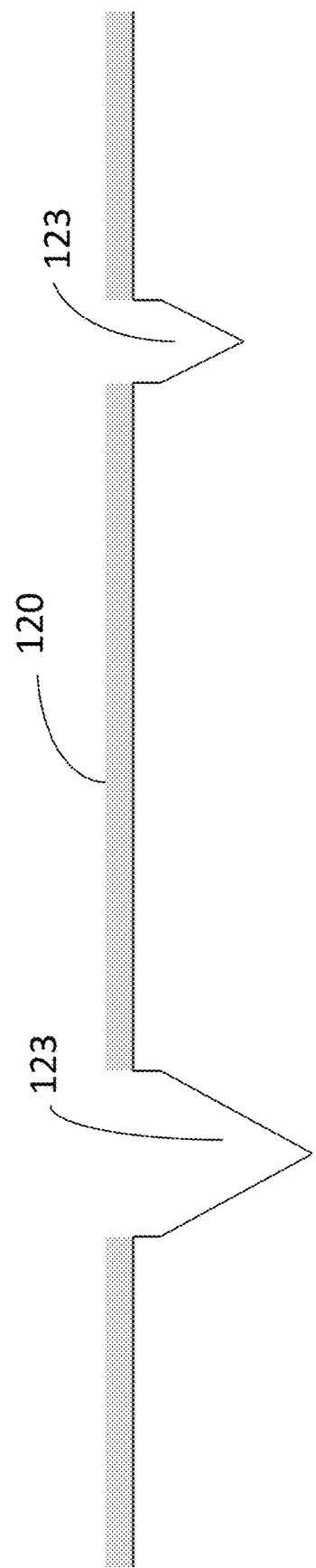
Figure 12C:
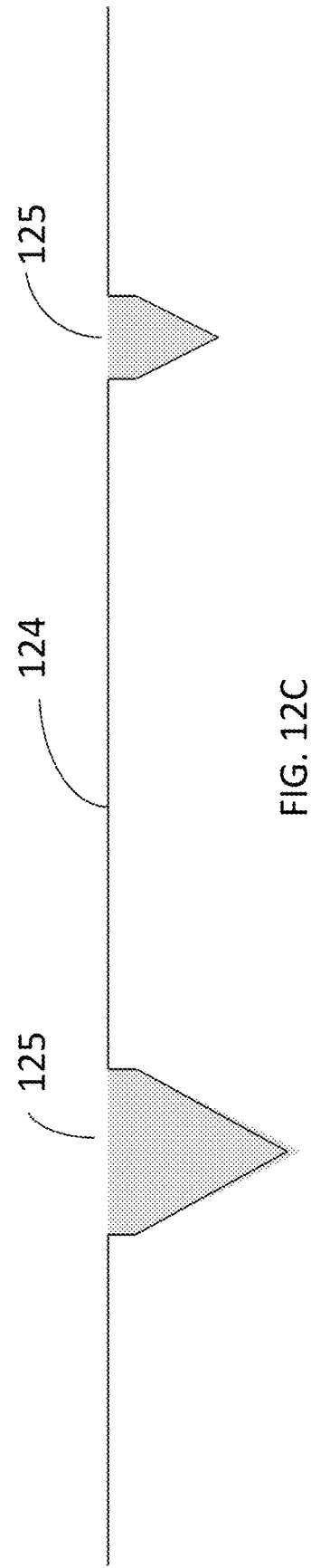

Reference is now made to FIGS. 12A, B and C, Y-direction cross-sections of an example of a stencil during its fabrication, according to an embodiment of the invention. In this case, as shown in FIG. 12B, vertical-sided V-grooves 123 may be etched by resist 120 masking, first a vertical etch for the power 122 and ground 121 lines, as shown in FIG. 12A, and then a V-groove etch 123, as shown in FIG. 12B. The resist may then be refilled into the V-groove trenches 125 and polished off to expose the silicon 124, as shown in FIG. 12C. The resist may serve as an etch stop for subsequent X-direction etches.

Reference is now made to FIGS. 10A and 10B, which show examples of diagrams of the stencil for the pads. In FIG. 10A, exposing the resist 105 may reveal the unmasked silicon 104 to form the pad. Then, in FIG. 10B, etching may be performed to form a stencil for a pad. While there may be no natural etch stop to form the pad stencil, the depth of etch 106 may not be critical, but the pad etching may still need to be performed in two steps, one for all the V-groove pads or just the shallower V-groove pads, and a separate mask for the deeper V-groove pads, for additional (in the case where the first etching is for all pads) or full pad etching (in the case where the first etching is only for the shallower V-groove pads).

Reference is now made to FIGS. 13A, B, C and D, cross-sections of an example of a stencil in the X-direction during its fabrication. A masked resist pattern 130 may be formed, which may be followed by a V-groove etch, as shown in FIG. 13A. Resist may then be reapplied and polished off, leaving resist in the existing V-grooves 132, and another V-groove etch may be performed, creating another set of V-grooves 133, as shown in FIG. 13B. The resist may then be removed, as shown in FIG. 13C, and a thin layer of non-adhesion material 134 may be applied to the stencil, as shown in FIG. 13D.

Figure 14:
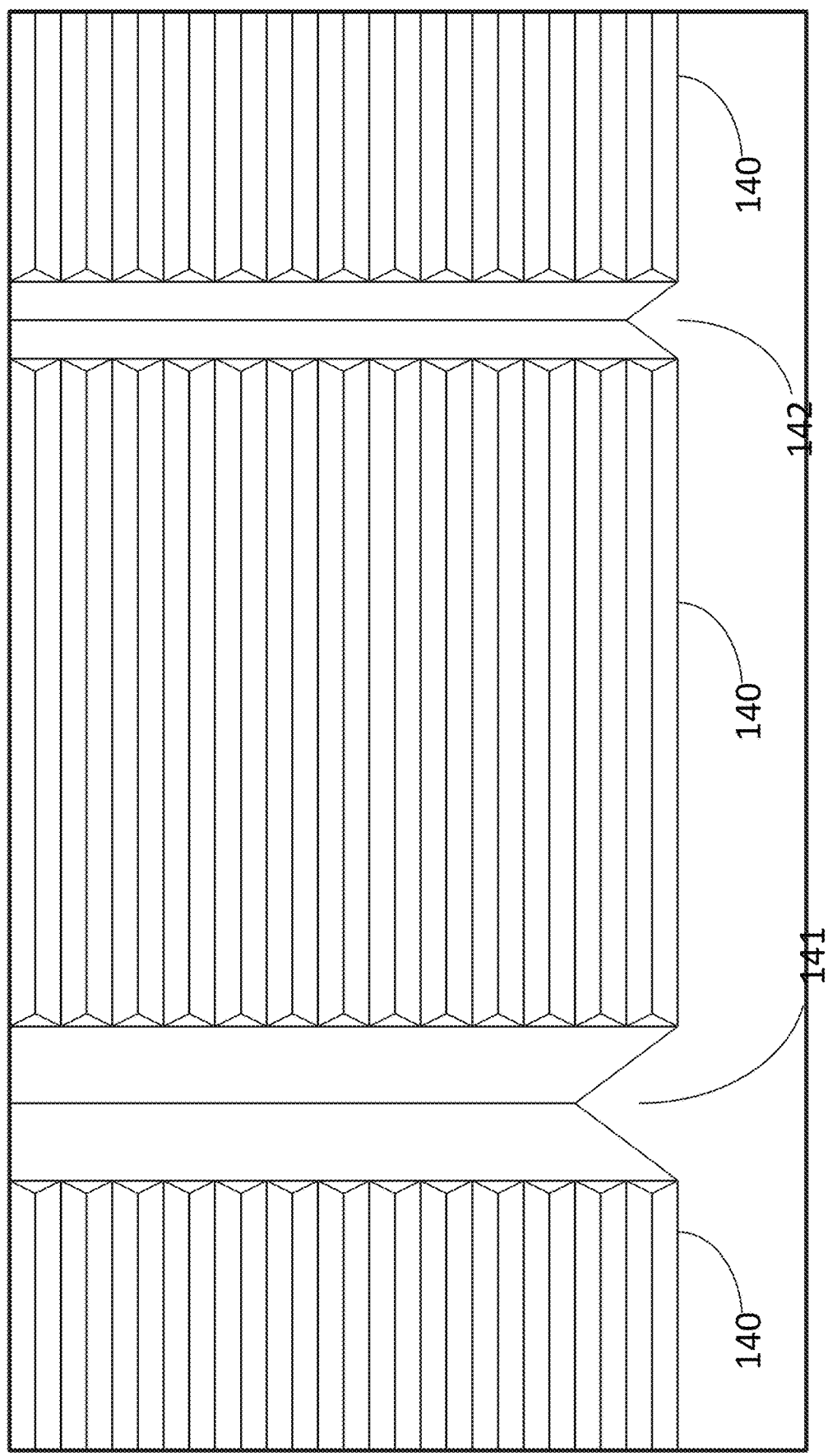
FIG. 14 is top cut away view of a section of an example of a stencil.

Reference is now made to FIG. 14, a top cutaway view of an example of a section of a stencil, according to an embodiment of the invention. In this case, the antenna X-direction V-grooves 140 may be substantially the same as those shown in FIG. 13D, and the V-groove trenches 141 and 142 may be substantially the same as those 125 shown in FIG. 12C. This may serve to facilitate the deposition of the power and ground lines on the stencil, prior to removing the finished antenna array from the stencil.

Figure 15A:
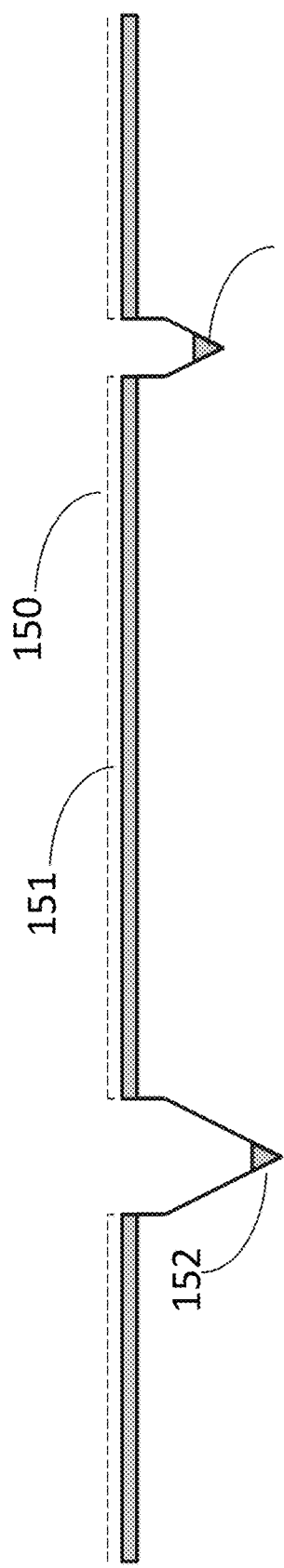
Figure 15B:
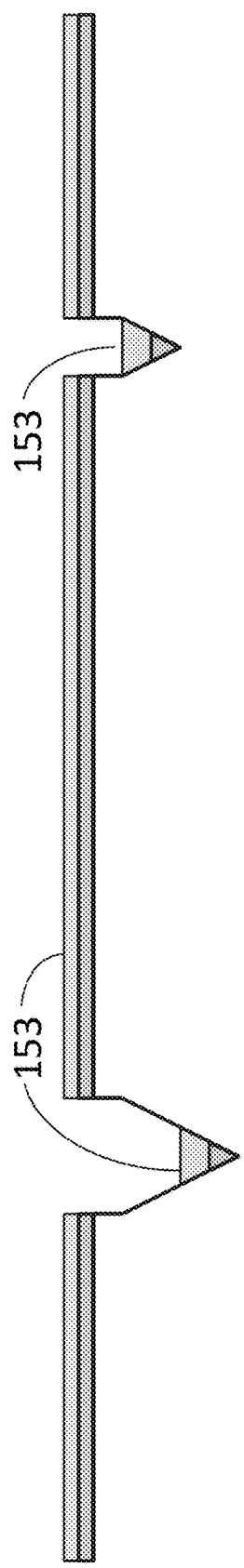
Figure 15C:
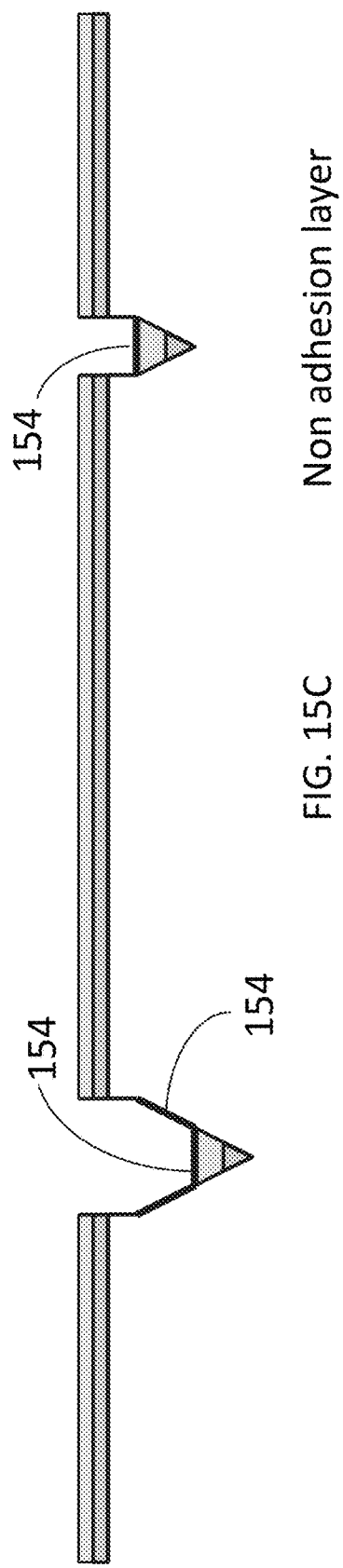

Reference is now made to FIGS. 15A through F, cross-sections of an example of a portion of an antenna array during fabrication on the stencil, according to an embodiment of the invention. Initially, as shown in FIG. 15A, a suitable conductive material, such as nickel, may be deposited onto the stencil to form the antenna 151, including the bottom of the trenches 152, which may be followed by a thin oxide layer. Next, as shown in FIG. 15B, cover glass may be deposited 153, which may be at least to the top of the X-direction V-grooves. In one embodiment, a short etch may be added to ensure that the oxide on the ends of the antennas 151 may be exposed. Ideally, the glass and conductive layer below it may be chosen to not adhere to the non-adhesion layer 134, as shown in FIG. 13D, on the stencil. Optionally, if the conductive materials for the power and ground lines may not be easily removed from the existing non-adhesion layer, in the next step, a thin layer of another non-adhesion material 154 may be deposited, as shown in FIG. 15C. Then, the conductive material for the power lines 155 shown in FIG. 15D and the ground lines 156 shown in FIG. 15E may be respectively deposited and polished off (as needed). Then, a flexible polymer 157, shown in FIG. 15F, may be deposited to form a backing for peeling the antenna array off of the stencil.

Figure 16A:
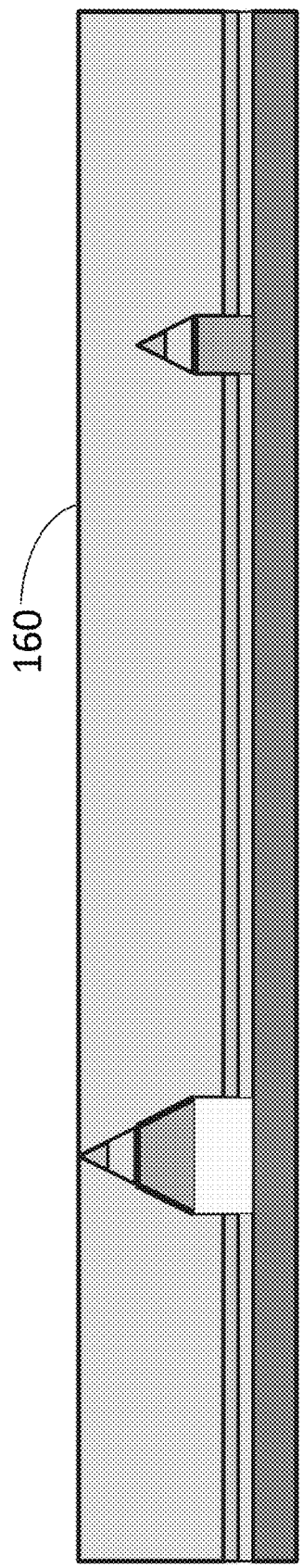
FIGS. 16A, 16B and 16C are cross-sections of an example of an antenna array during its fabrication after removal from a stencil.
Figure 16B:
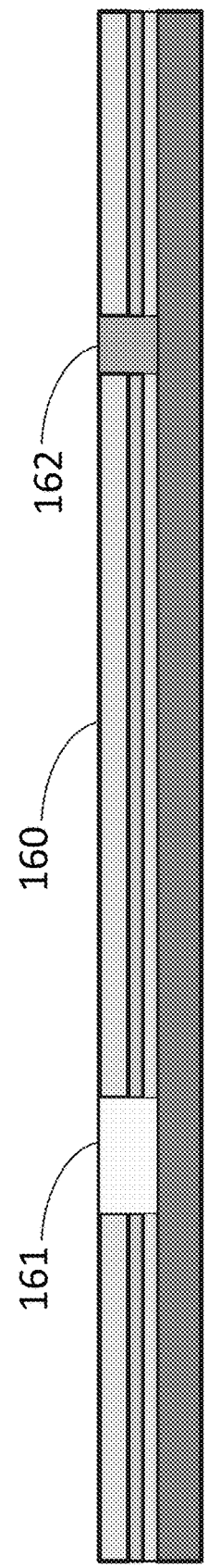
Figure 16C:
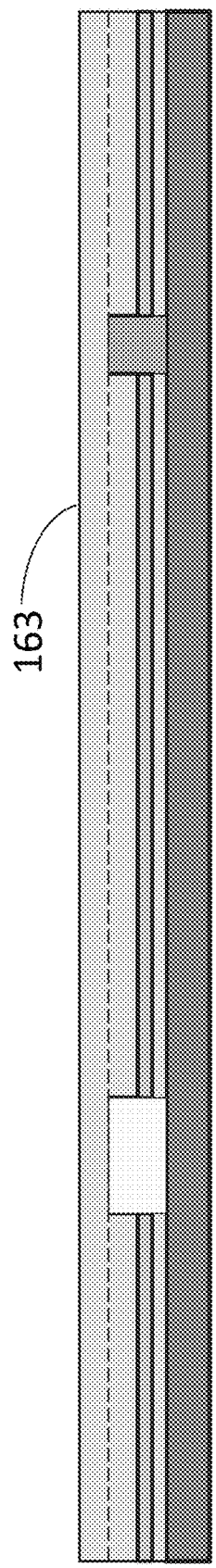

Reference is now made to FIG. 16A, a cross-section of an example of an antenna array, peeled from the stencil and flipped over, with an added cover glass layer, according to an embodiment of the invention. Optionally, this thick cover glass may be polished to remove the unnecessary layers down to the power 162 and ground 161 conductive materials, as shown in FIG. 16B, and an additional passivation material 163 may be added to cover the exposed conductive materials, as shown in FIG. 16C. It should be noted that other fabrication steps may be added, or the steps described herein may be modified as necessary to improve the yield of the antenna arrays, or for preservation of the stencils.

Reference is now made to FIGS. 8A through 8D, which show an example fabrication process of aligning two layers of rectifying antenna arrays. In FIG. 8A, both pads for power 82 and ground 83 are shown as wider versions of the same large V-groove metal layers fabricated for the rectifying antenna in a sub-pixel. The layers may be peeled off the stencil in the same manner as the solar array technology of U.S. patent application Ser. No. 13/454,155, noted above. Electrical separation between sub-pixels may occur by not etching the stencil between sub-pixels such that all the deposited metal may be removed, leaving just the polymer backing 81 after post-peel polishing. In FIG. 8B, the same polish and cover polymer 84 may be applied to create the region 88 between sub-pixels, but in addition, the pads may be masked to eliminate the polymer 85 on them. Solder bumps 86 may then be applied, as shown in FIG. 8C. The bottom layer may be flipped over, patterned with an additional mask and etched to the metal 87 through the original polymer backing 81, as shown in FIG. 8D.

Figure 9:
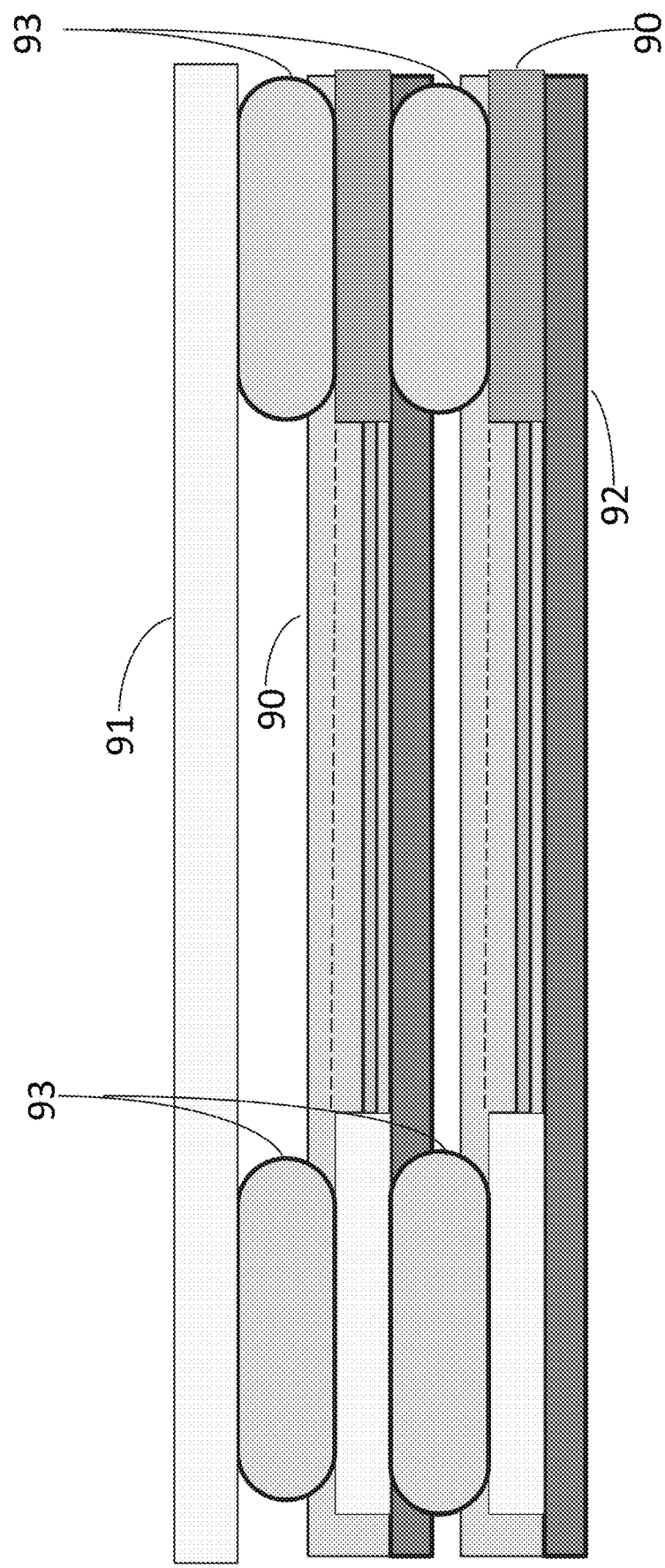
FIG. 9 is a diagram of the cross section of aligning two layers of rectifying antenna array to the TFT glass layer, according to an embodiment of the invention.
Figure 10:
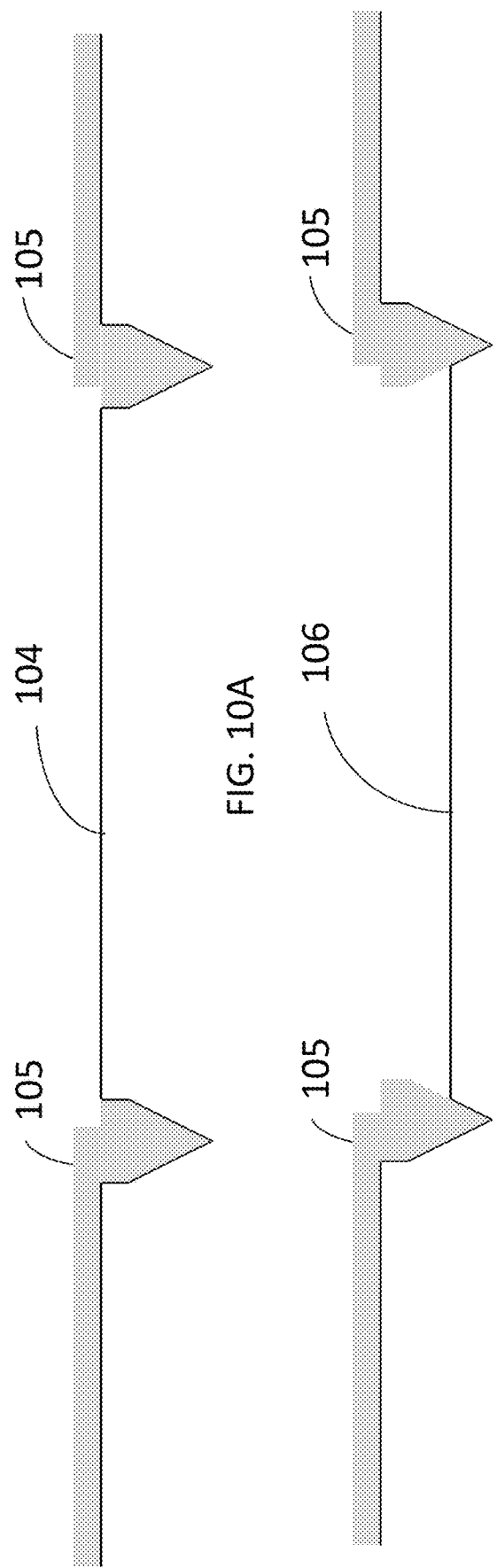
FIGS. 10A and 10B are cross sections of an example of a stencil for the solder bump pads.

Reference is now made to FIG. 9, a diagram of an example of a cross-section of two layers of rectifying antenna array vertically connected to a glass substrate containing an array of thin film transistors and metal interconnect, according to an embodiment of the invention. The two layers 90 may be sandwiched together with the glass substrate 91 and flipped over such that the upper polymer backing 92 may be above the glass substrate 91. The sub-pixel pad sizes and spacing may be consistent with current LCD-TFT technology, making it practical to align and connect the solder bumps between two layers rectifying antenna sub-pixels, thereafter aligning and connecting the two layers of solder bumps to pads on the glass substrate.

Figure 3:
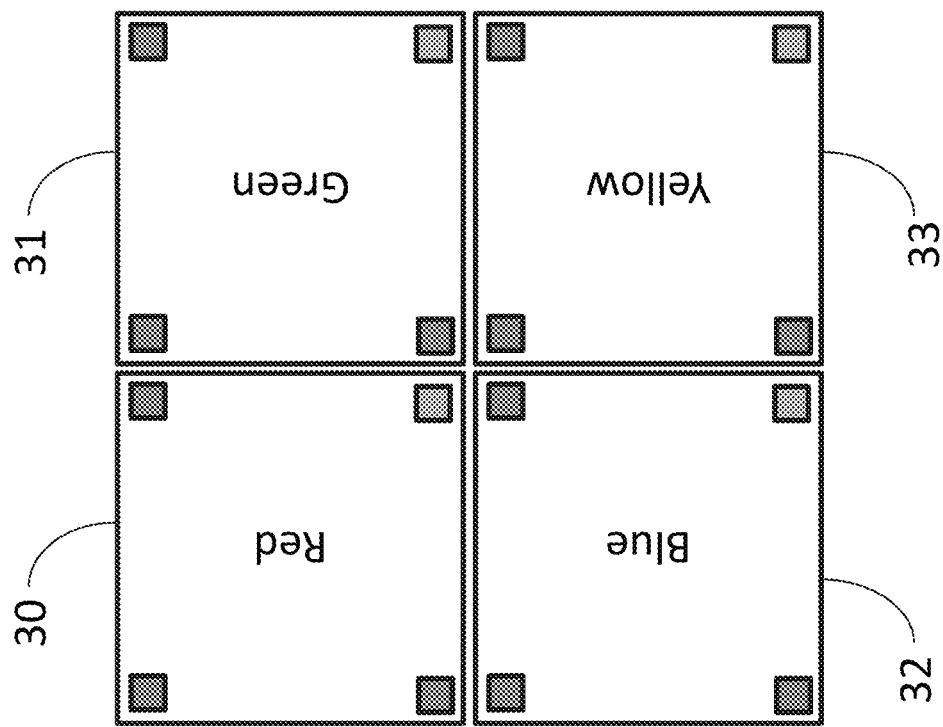
FIG. 3 is a diagram of one pixel area of the second rectifying antenna array layer, flipped and rotated to connect with the first layer, according to an embodiment of the invention.
Figure 2:
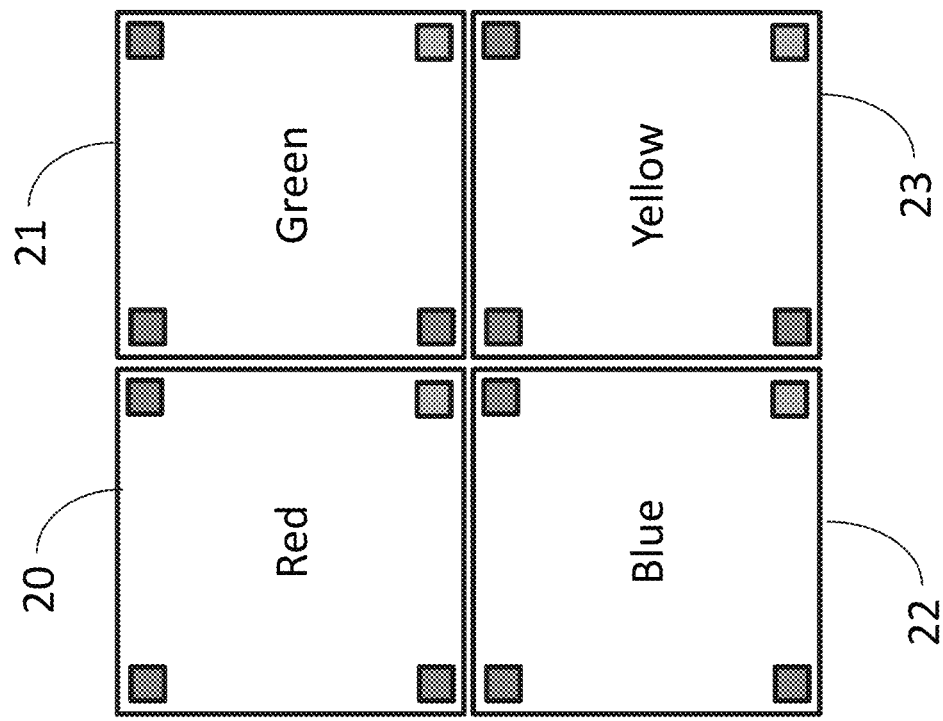
FIG. 2 is a diagram of one pixel area of the first rectifying antenna array layer, composed of four color sub-pixels, according to an embodiment of the invention.

Reference is now made to FIG. 2, a diagram of an example of one pixel area of a first rectifying antenna array layer, composed of four color sub-pixels, where the colors, red 20, green 21, blue 22 and yellow 23, may be determined by the length of the nickel antenna lines. Reference is now made to FIG. 3, a diagram of an example of one pixel area of a second rectifying antenna array layer, flipped and rotated with respect to the organization of the first layer, to vertically connect with the first layer. Note that the sub-pixels 30, 31, 32 and 33 may be oriented such that their colors vertically align with the sub-pixels 20, 21, 22, and 23 on the first layer.

Figure 4:
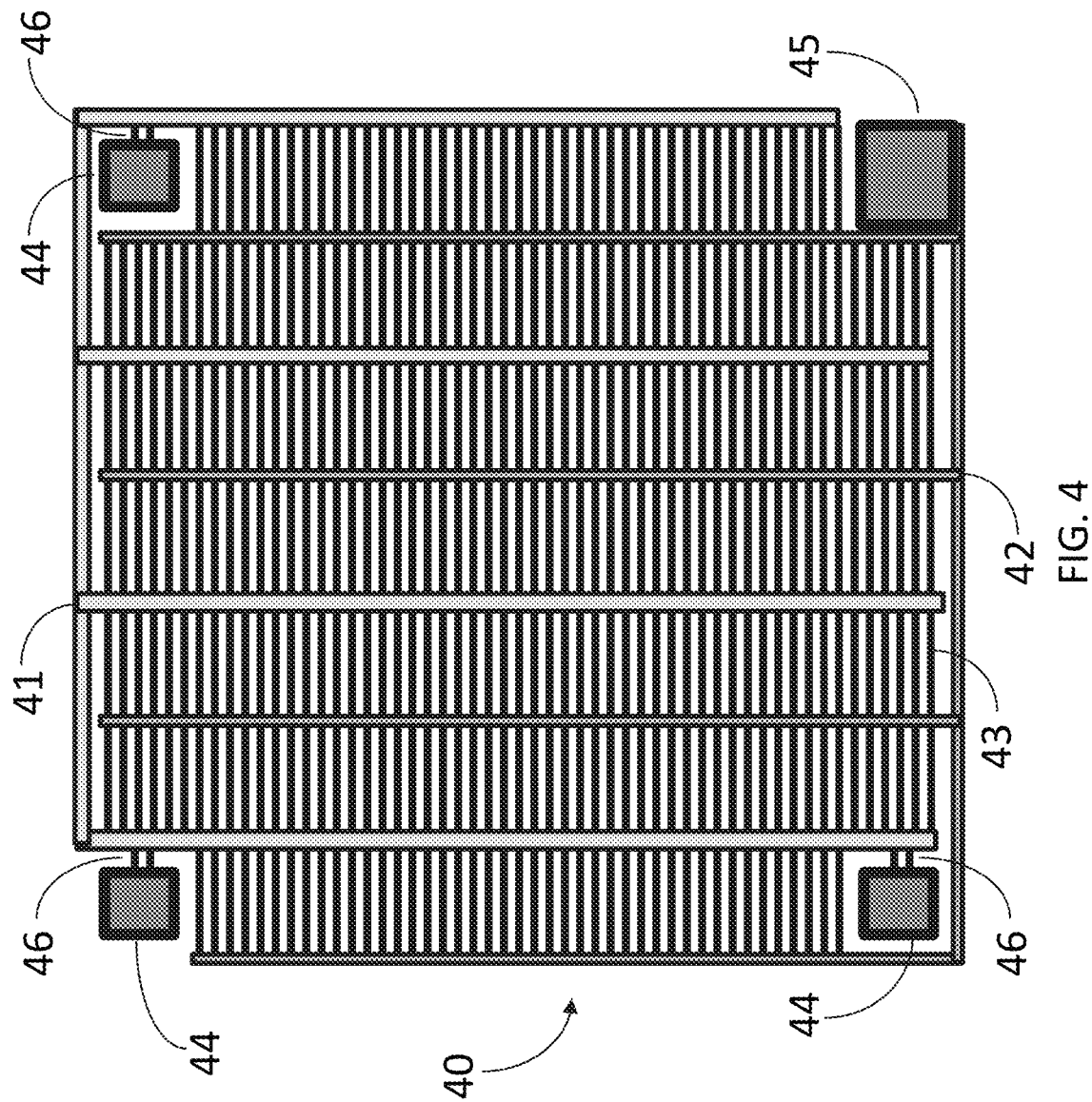
FIG. 4 is a diagram of a single layer of a single color sub-pixel, according to an embodiment of the invention.

Reference is now made to FIG. 4, a diagram of an example of a single layer of a single color sub-pixel 40 composed of an array of antennas 43, which may be, for example, composed of nickel, but which are not thus limited (while "nickel" is discussed below, it should be understood that the material is not limited to nickel), between the V-groove generated power 41 and ground grids 42, and four pads 44 and 45. Note that three pads 44 of the four pads may be identically connected to the power side of the antenna diode array via back-to-back tunnel diodes 46, while the last pad 45 may be connected to the ground grid 42 of the rectifying antenna array 40.

Figure 5:
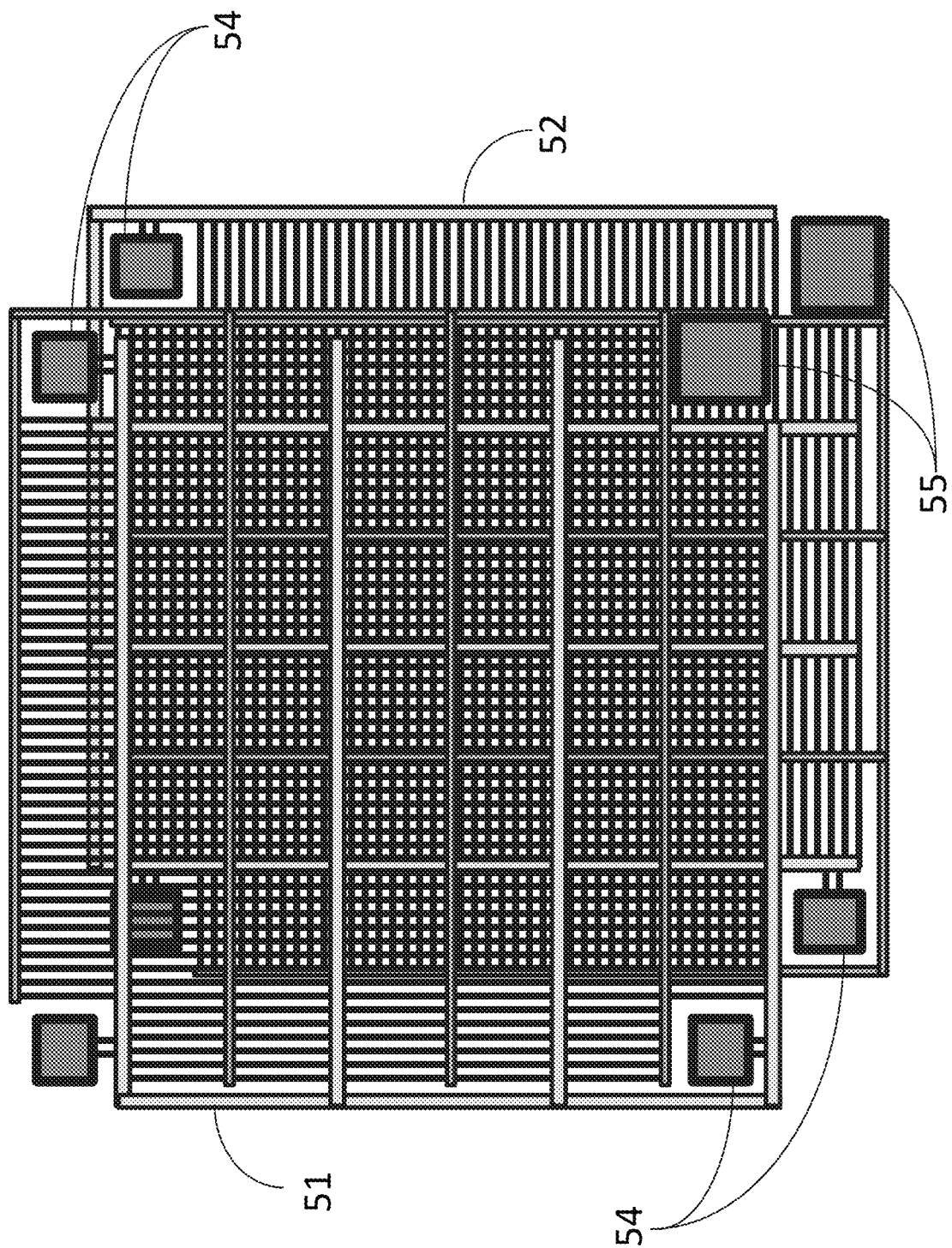
FIG. 5 is a diagram of two layers of a single color sub-pixel, according to another embodiment of the invention.

Reference is now made to FIG. 5, a diagram of an example of two rectifying antenna array layers 51, 52 aligned vertically with respect to each other to form a single sub-pixel. Light oriented perpendicular to the nickel lines may be transmitted through a single layer of the rectifying antenna array. The antenna arrays of the two layers 51, 52 may be oriented perpendicular to each other, such that they transmit or absorb all orientations of light around twice the wavelength of the nickel lines. Note that the identical pads 54 of each layer and the identical pads 55 of each layer may be vertically aligned.

Figure 6:
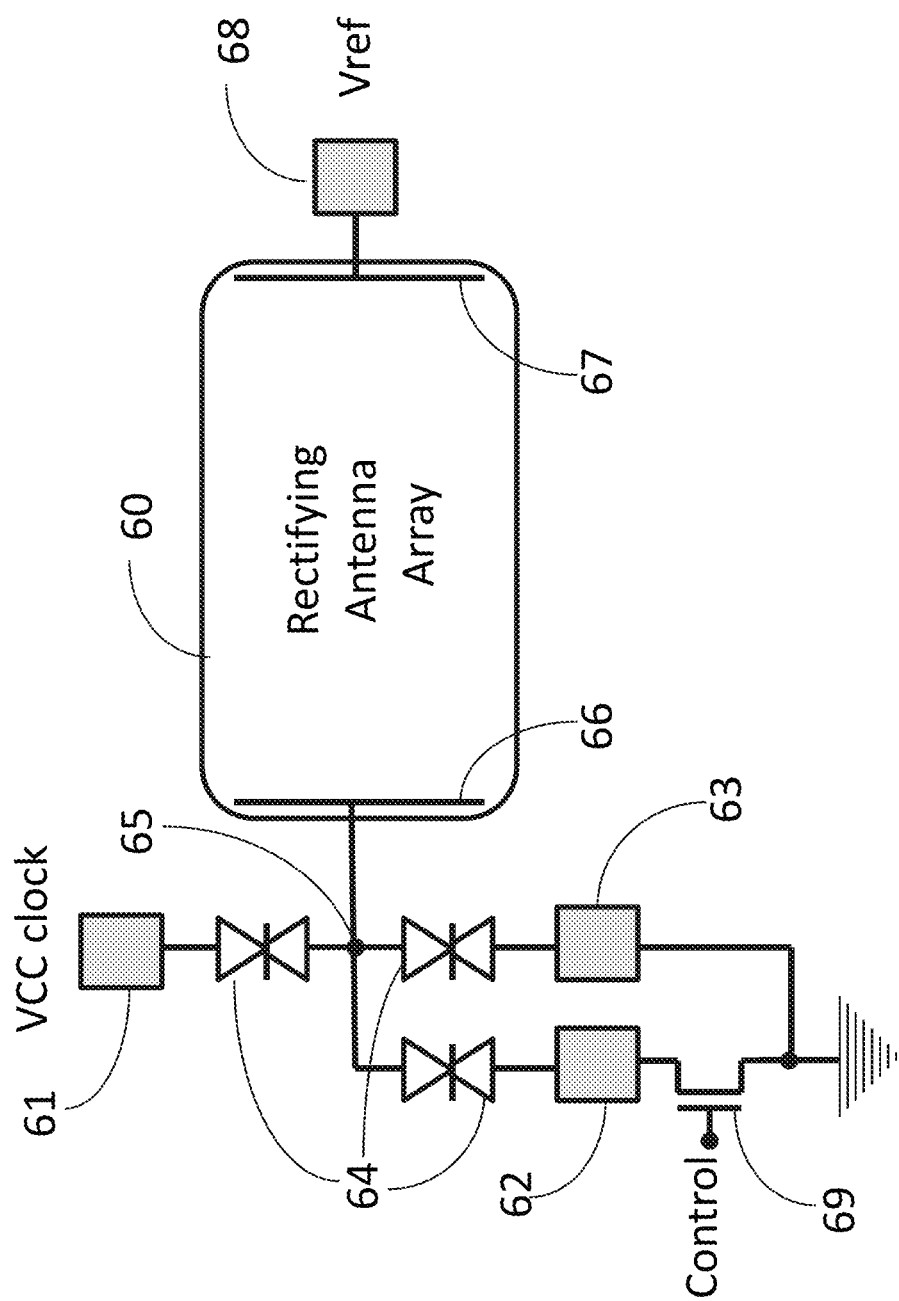
FIG. 6 is a diagram of the logical connections of the thin film transistor (TFT) to the four pads of each layer of a single color sub-pixel.

Reference is now made to FIG. 6, which shows an example of the logical connections of the four pads to a sub-pixel rectifying antenna array 60. Each of the three pads 61, 62, and 63 may be connected to back-to-back pairs of tunnel diodes 64, all of which may be connected to an internal node 65 of the power grid 66 of the rectifying antenna array 60. The ground grid 67 of the rectifying antenna array 60 may be connected to a reference voltage pad 68. Together, the three back-to-back tunnel diode pairs 64 may form a tunnel diode latch circuit, which, when a clock signal on pad 61 transitions from ground to Vcc, may either latch with high voltage, near Vcc, or low voltage, near ground, on the intermediate node 65, which may depend on whether an external TFT 69 may be set to float or to ground the pad 62. Note that, using a different logical arrangement, as would be apparent to one of ordinary skill in the art, such operations may occur on the opposite clock transitions. By setting the reference voltage pad 68 of the rectifying antenna array 60 to a voltage midway between the high and low latched voltages, the rectifying antenna array may be either reverse or forward biased. A sub-pixel's antenna array may be reverse biased, which may cause it to act like a solar cell, absorbing light and causing the sub-pixel to look black, or a pixel's antenna array may be forward biased, causing the sub-pixel to glow with its specific color, when stimulated with a corresponding frequency of light which may be subsequently amplified.

Reference is again made to FIG. 4. The numbers and sizes of the back-to-back tunnel diodes 46 may be adjusted to enhance the oscillation of the associated rectifying antenna array 40, given an appropriate positive transition of the clock signal on pad 61 when putting the sub-pixel into a forward biased state (as noted above, it is straightforward to modify the circuitry to use a negative transition, instead of a positive transition).

Figure 7:
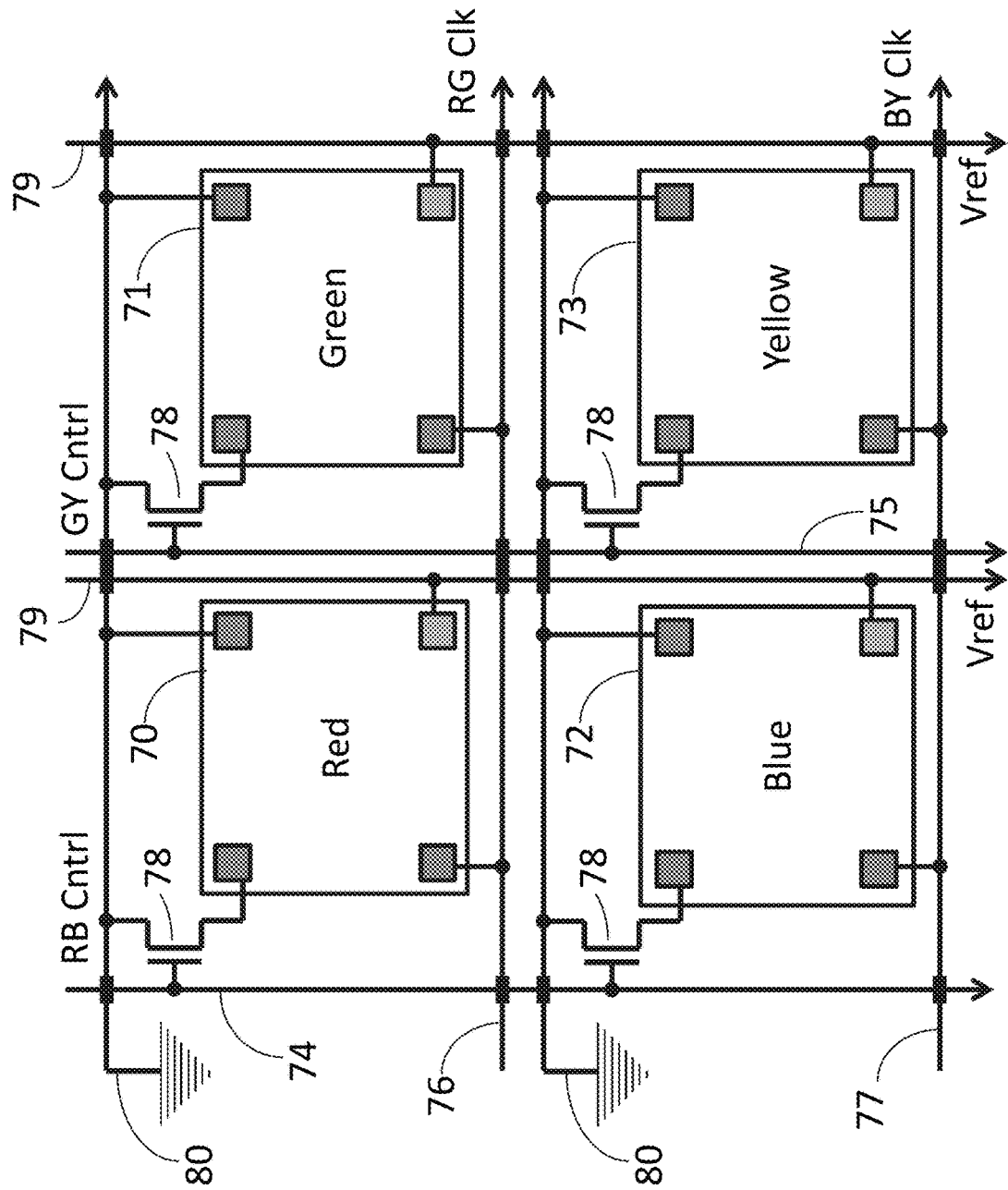
FIG. 7 is a diagram of the wiring of the four sub-pixels of a pixel area, according to an embodiment of the invention.

Reference is now made to FIG. 7, which shows an example of the wiring of four sub-pixels 70, 71, 72, and 73 of a pixel. On a row-by-row basis, for each row of sub-pixels, one clock at a time, the RB 74 and GY 75 controls may be set for all columns, and a negative clock pulse may be issued to the RG 76 or BY 77 clock. Once the clock returns high, the states of all sub-pixels in the corresponding row may be latched until the next negative clock pulse resets them (again, while the discussion focuses on logic using the negative and positive clock pulses in this manner, by making known modifications to the circuitry, negative and positive pulses may be reversed). In this manner, the entire panel may be switched by successively setting all the control lines and issuing a negative clock pulse on each row's clock. For each row, the Red 70 and Green 71 sub-pixels may be switched together, with a Red-Green clock pulse on the RG 76 clock line, distinctly separately from the Blue 72 and Yellow 73 sub-pixels, which may be switched together, using a Blue-Yellow clock pulse on the BY 77 clock line. One pad 68 of each sub-pixel may be connected to a common set of voltage reference lines 79, and the last pad 63 of each sub-pixel may be connected to a common set of ground lines 80 (note that pads 63 and 68 are shown in FIG. 6).

It is further contemplated that additional circuitry may be coupled to the reference voltage lines to both allow the reverse biased sub-pixels to power the forward biased sub-pixels and to extract the residual power from the display when the number of reverse biased sub-pixels sufficiently exceeds the number of forward biased sub-pixels to generate power.

It is also contemplated that the reference voltage and/or clock voltages may be varied to increase the amount of light amplification of the forward biased sub-pixels. Furthermore, these voltages may be dynamically adjusted in a manner that may be related to the measured amount of power detected from the display, thereby dynamically adjusting the brightness of the display in relation to the amount of ambient light.

It is also contemplated that the reference voltage lines may be combined to form an array of separate grids, where each grid may comprise an M-by-M array of pixels, such that measurement of the power generated by each grid may be used to detect the presence of finger shadows for use in interactive display operation. Power from reverse biased pixels may drop off when a finger blocks the ambient light to the array of pixels within the measured grids. As such, the grids may be comprised of sufficient pixels to determine the center of the finger shadow.

Alternatively, in yet another embodiment of the invention, the first and second antenna layers may be connected to separate reference voltage lines or grids, which may thereby allow the presence of fingers to be sensed by differential current on the separate reference voltages lines due to capacitive changes in the pair of antenna layers.

Figure 17:
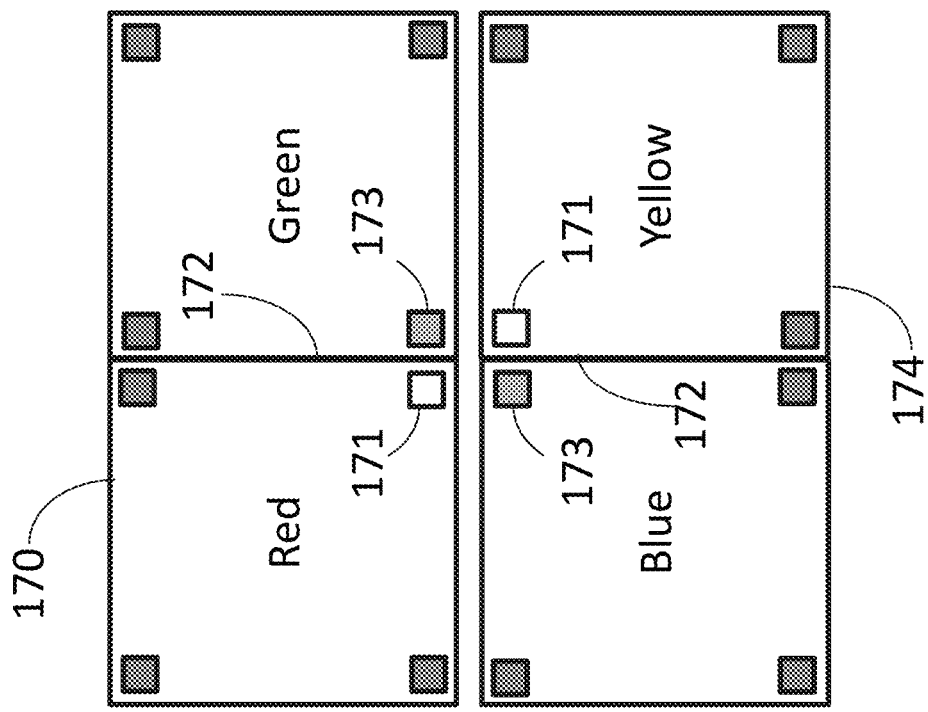
FIG. 17 is another diagram of one pixel area of the first rectifying antenna array layer, composed of four color sub-pixels, according to an embodiment of the invention.

Reference is now made to FIG. 17, another example diagram of one pixel area of a first rectifying antenna array layer, composed of four different color sub-pixels, according to an embodiment of the invention. In this case, the adjacent sub-pixels 170 and 174 may be rotated and flipped such that the ground grids 42, as seen in FIG. 4, are adjacent to each other. By connecting 172 the adjacent ground grids together, one pad 173 may be externally connected to a reference voltage line or grid for each pair of horizontally adjacent sub-pixels. The other pad 171 may be disconnected, which may allow for vertical connections to a glass substrate via solder bumps 93, e.g., as seen in FIG. 9.

Figure 18:
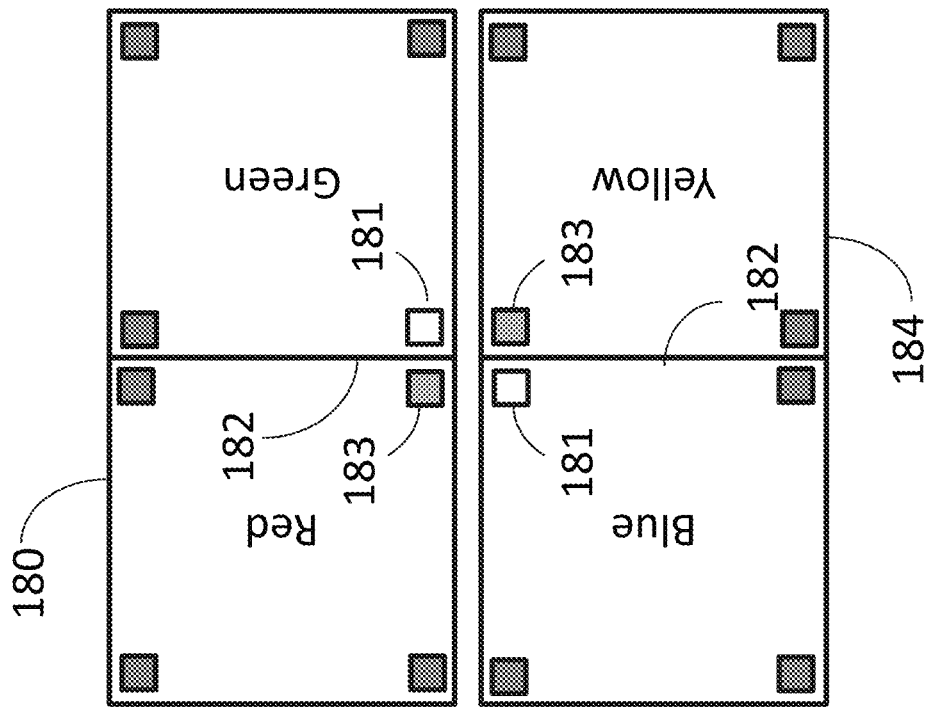
FIG. 18 is another diagram of one pixel area of the second rectifying antenna array layer, flipped and rotated to connect with the first layer, according to an embodiment of the invention.

Reference is now made to FIG. 18, another example diagram of one pixel area of a second rectifying antenna array layer, flipped and rotated to connect with the first layer, according to an embodiment of the invention. In this case, the adjacent sub-pixels 180 and 184 may be rotated and flipped such their ground grids are also adjacent and connected 182 to each other, and as with FIG. 3, their antennas may be perpendicular to the sub-pixels in FIG. 17. Similar to FIG. 17, one pad 183 may be externally connected to a reference voltage line or grid for each pair of horizontally adjacent sub-pixels 180 and 184. The other pad 181 may be disconnected, which may allow for vertical connections to a glass substrate, e.g., via solder bumps 93, as seen in FIG. 9. Note that the disconnected pads 181 and 171 of a given layer, may vertically align with the other layer's connected pads 173 and 183.

Figure 19:
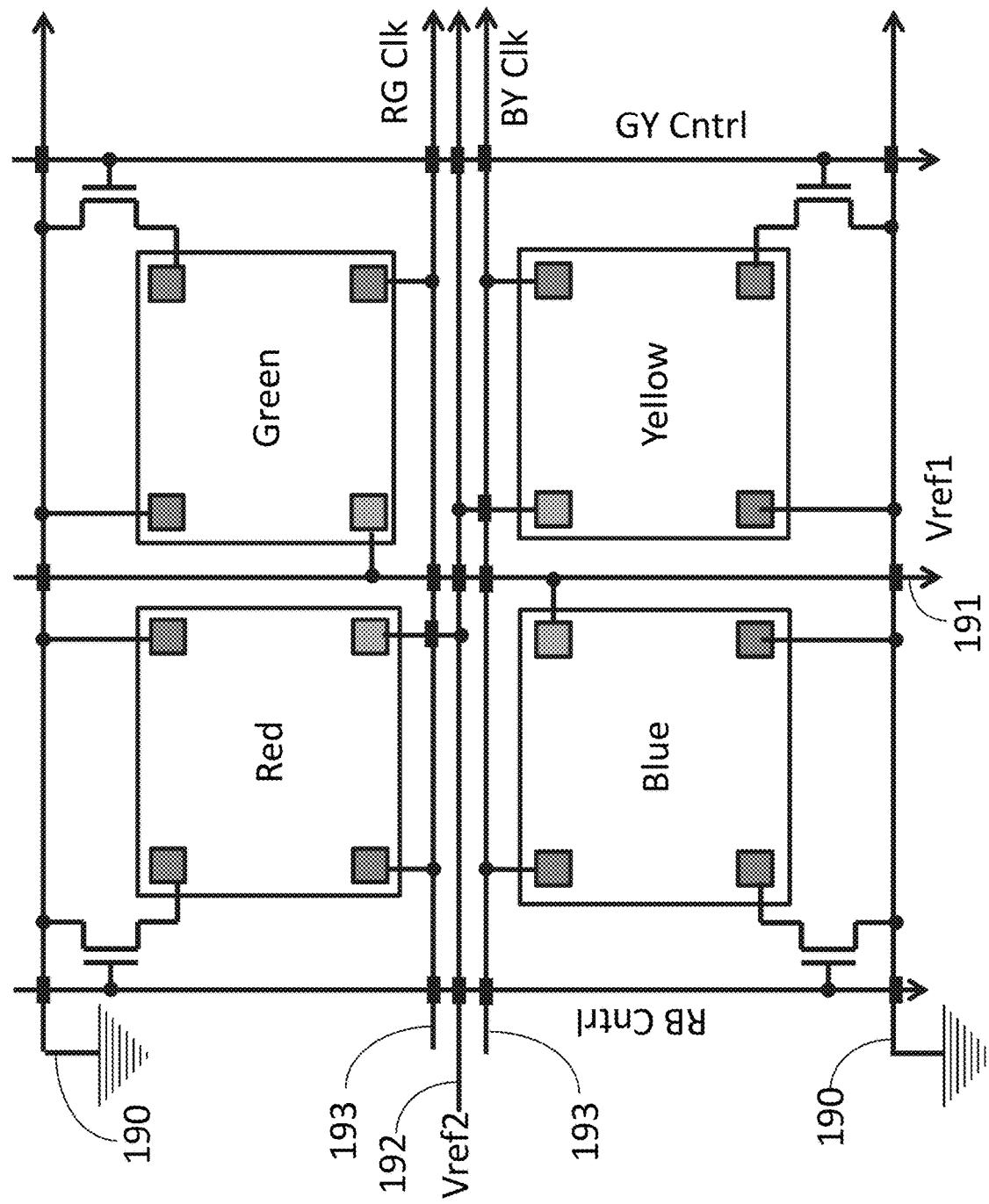
FIG. 19 is another diagram of the wiring of the four color sub-pixels of a pixel area, according to an embodiment of the invention.

Reference is now made to FIG. 19, another diagram showing an example of the wiring of the four color sub-pixels of a pixel area, according to an embodiment of the invention. In this case, the clock 193 and ground 190 lines may be organized to allow the voltage reference for the first layer 191 to be perpendicular to the voltage reference for the second layer 192. In this manner, separate reference voltage grids may be created to measure the capacitance between the two layers, which may be done on an M-by-M pixel basis.

In addition, when a portable device containing such a low-power semi-reflective display turns off its display to conserve power, the display may be put into a configuration such that all sub-pixels may generate power to recharge the batteries of the portable device.

It is also contemplated that when the electronics in a portable device are powered off or in a sleep mode, the display may also remain in a configuration to measure the capacitance on each M-by-M pixel grid, which may be used to enable sensing when a user touches the screen, to thereafter permit the device to turn on the electronics and the display for viewing. Furthermore, when turning on the electronics from a powered off state, a start up procedure may be initiated, which may include an unlocking method comprising the detection of a dynamic sequence of finger movement around the screen, matching such a sequence of movements to a predetermined sequence, and if successful, finishing the start up process, or if not successful, terminating the process and powering the device back off. Such a predetermined sequence may be a standard factory programmed sequence, a unique factory programmed sequence, documented to the purchaser, a stored user generated sequence, or a temporary user generated sequence. In this manner, the portable device may not require buttons or switches to power on or off the device; rather it may be sufficient to have a locked back battery compartment and an automatic power on sequence when reconnecting the disconnected batteries. Such a power cycling may erase any temporary user generated sequence, requiring an earlier stored sequence to be used to start up the device. Any or all of these predetermined sequences may be used to unlock the device. Also, when powering on a portable device in low ambient light, detected by a sufficiently low level of power generated by the display, the device may automatically turn on auxiliary light(s) to aid in seeing the portable device and its display.

It is further contemplated that when the portable device powers off the display, if the level of power generated by the display falls below some threshold, the display may be electrically disconnected to minimize the consumed standby power, leaving a single M-by-M voltage grid in power generation mode to detect either an increase in the ambient light that is sufficient to turn the screen back on, or to detect a change in the grid's capacitance indicating a touch, which may thereby cause the screen to power back on and begin a start-up process.

Finally, such techniques when combined may allow suitably stored portable devices to seldom, if ever, need external recharging. As such, with adequately robust batteries and artificially lit or transparent storage containers, such portable devices may be completely sealed, relying solely on wireless communications and the touch sensitive display for external communication.

Figure 20C:
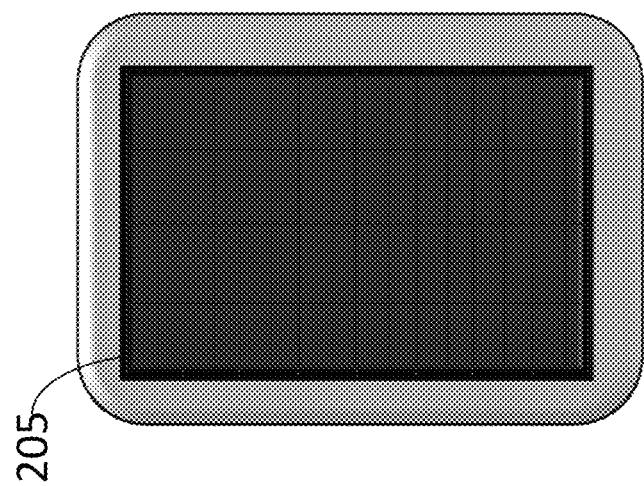
FIGS. 20B and 20C are back views of examples of portable devices.
Figure 20B:
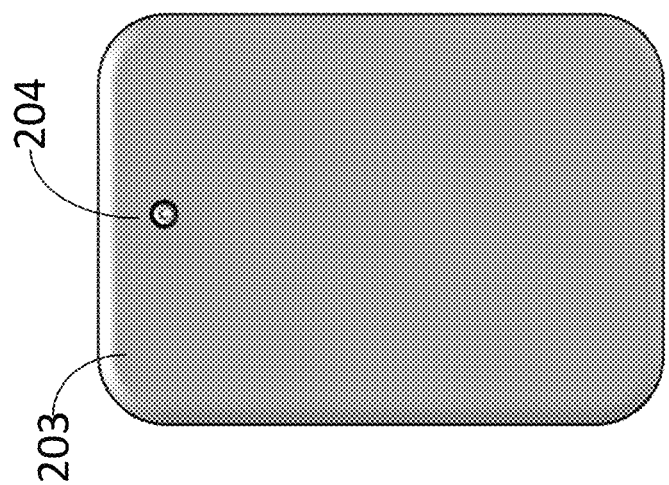
Figure 20A:
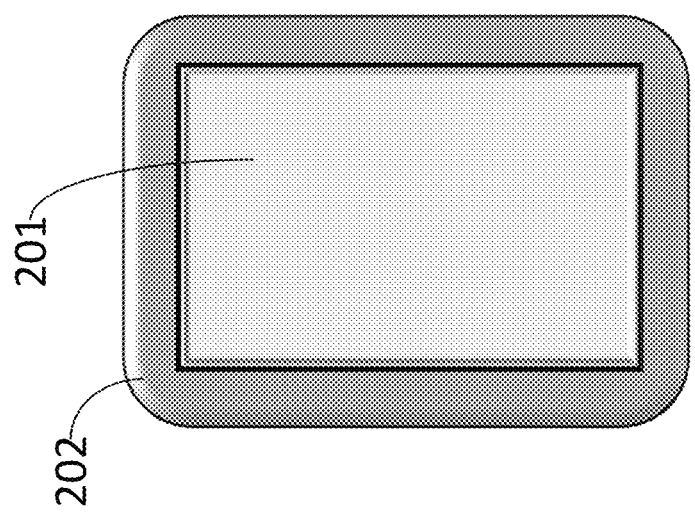
FIG. 20A is a front view of an example of a portable device containing a display.

Reference is now made to FIGS. 20A and 20B, examples of front and back views of a portable device. Note that the display 201 may be embedded in the front half of a plastic case 202, which may be glued to the back half of the plastic case 203, such that no external components, buttons, connectors, compartments or antennas may protrude through the enclosure. The display may be a low power semi-reflective display as described above. Optionally, other devices, such as a camera or light sensor 204, may be embedded behind other smaller openings, e.g., in the back of the plastic case 203. Moving parts, such as rotating storage, microphones, speakers and/or other mechanical devices may be connected via Bluetooth® or other suitable wireless communication techniques. Power may be obtained from the low power semi-reflective display embedded in the front of the plastic case, and may be stored in a rechargeable battery internal to the device.

Reference is now made to FIG. 20C, the back view of another example of a portable device. Alternatively, the front half of the case may have a traditional touch activated reflective display, and the back half of the case 205 may have an embedded solar cell 206 from which power may be obtained to be stored in a rechargeable battery internal to the device.

Such portable devices may become increasingly attractive due to falling costs of and improvements in batteries, electronics, displays and/or solar cells, along with the additional cost reduction and increased reliability of the system by eliminating mechanical connections, simplifying the enclosure, removing movable parts, and integrating a recharging battery. By being completely sealed, such devices may be designed to be rugged, waterproof, and/or disposable.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which may be not in the prior art.

I claim:

1. A portable device, comprising:
    a case having first and second parts configured to be sealed together in parallel;
    a rechargeable battery;
    other electronic components; and
    a touch screen display;
    wherein the touch screen display is embedded in the first part of the case, and wherein the case is arranged to completely seal the portable device, wherein the first and second parts of the case are glued to each other using a permanent glue, relying on wireless communications and the touch screen display for external communication.

2. The portable device as in claim 1, wherein the other electronic components include one or more cameras embedded in one or both parts of the case.

3. The portable device as in claim 1, wherein the other electronic components include control systems and wireless communication systems enclosed in the case.

4. The portable device as in claim 1, wherein, in at least one mode, the touch screen display is configured to control an electronic component to charge the rechargeable battery.

5. The portable device as in claim 1 wherein the touch screen display is configured to measure capacitance on pixels of the display to sense when a user touches the display, to turn on at least one electronic component from a powered off state.

6. The portable device as in claim 5, wherein detection of a predefined pattern of dynamic finger movements is used to unlock the display, and wherein detection of any other pattern of dynamic finger movements results in at least one electronic component being powered off.

7. The portable device as in claim 6, wherein in one mode, a user defined pattern of dynamic finger movements is the predefined pattern of dynamic finger movements, and wherein in at least one other mode, a factory defined pattern of dynamic finger movements is the predefined pattern of dynamic finger movements.

* * * * *